United States Patent [19]
Grothaus et al.

[11] Patent Number: 5,311,067
[45] Date of Patent: May 10, 1994

[54] HIGH PERFORMANCE PULSE GENERATOR

[75] Inventors: Michael G. Grothaus, Dahlgren; Stuart L. Moran, Fredericksburg; Leonard W. Hardesty, King George, all of Va.

[73] Assignee: The United States of America as represented by the Secretary of the Navy, Washington, D.C.

[21] Appl. No.: 898,597

[22] Filed: Jun. 15, 1992

[51] Int. Cl.[5] .......................... H01J 7/44; H01J 17/20; H02M 3/18
[52] U.S. Cl. ..................................... 307/108; 313/568; 363/59; 307/110
[58] Field of Search ..................... 363/59, 60; 307/108, 307/110; 313/567–574; 315/111.31, 111.11, 330

[56] References Cited

U.S. PATENT DOCUMENTS 4,105,952  8/1978  Tulip ................................ 331/94.5
4,121,128  9/1978  Roberts .............................. 313/7

Primary Examiner—A. D. Pellinen
Assistant Examiner—Aditya Krishnan
Attorney, Agent, or Firm—John D. Lewis

[57] ABSTRACT

The device is a compact Marx-type generator capable of producing a high-voltage burst of pulses having rise-times less than 10 nanoseconds at repetition rates up to 10 kHz. High-pressure hydrogen switches are used as the switching elements to achieve high rep-rate. A small coaxial design provides low inductance and a fast rise-time. The device may be used as a high-rep-rate high-voltage trigger generator, or as a high-voltage pulse source capable of producing up to 1 MV pulses at high repetition rates.

6 Claims, 6 Drawing Sheets

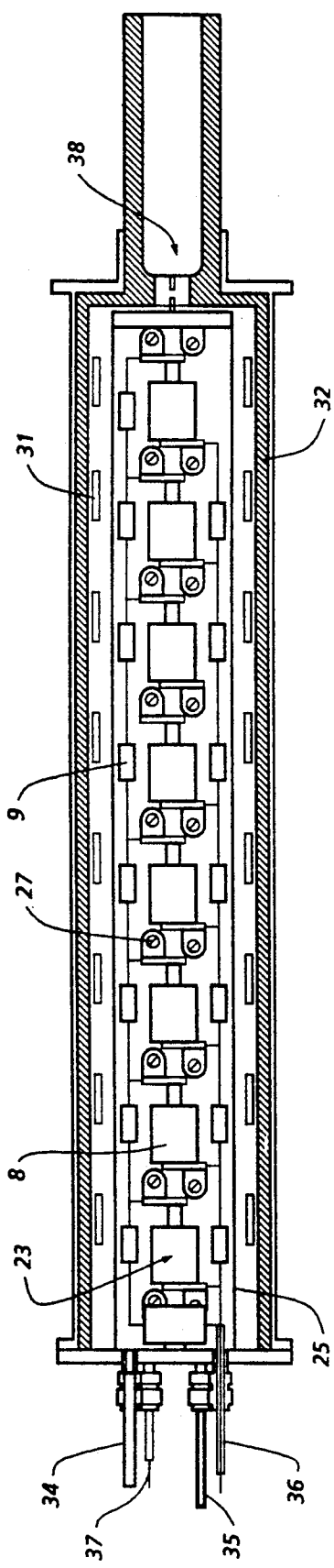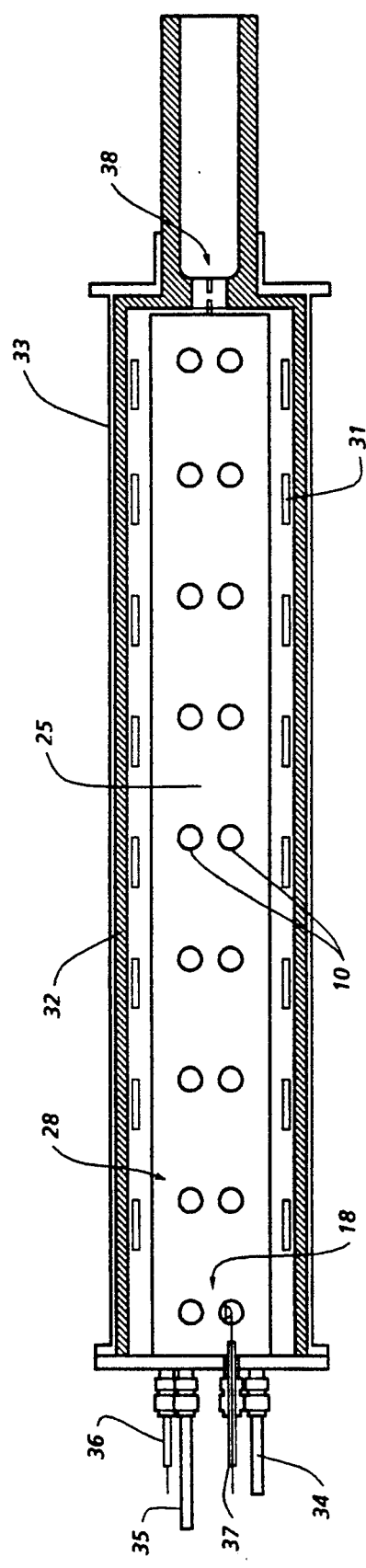
FIG. 5a
FIG. 5b

HIGH PERFORMANCE PULSE GENERATOR

The invention described herein may be manufactured and used by or for the Government for Governmental purposes without the payment of any royalty thereon.

BACKGROUND OF THE INVENTION

The present invention relates generally to pulsed power systems, and more specifically, the invention pertains to pulsed power systems requiring a high-voltage, high-repetition rate trigger requiring a pulse having a fast-risetime. The invention finds use in driving circuitry for a recirculating linear accelerator in particular, and generally in wideband electronics countermeasure systems, short pulsed radars, communications systems, and calibration systems.

The task of providing the high-voltage triggers for high-voltage, high-power gas switches operating at greater than kilohertz repetition rates has been problematical. Although gas spark gap switches such as that taught in U.S. Pat. No. 3,983,438 by Levatter et al. issued Sep. 28, 1976, are capable of very high-power operation, they are typically limited in achievable repetition-rate. Improvements in this art have recently exhibited recovery times in the range of 100 microseconds by using undervolting techniques and hydrogen gas insulation as taught by U.S. Pat. No. 4,912,369 to Moran et al. issued Mar. 27, 1990. While this represented a double order of magnitude improvement in switch repetition rates and had the advantage of not requiring gas flow, no adequate triggering device was known to exist which exhibits multiple pulse capability.

Switch recovery tests are typically performed in a two-pulse configuration, where the switch is triggered only once and then the voltage is reapplied to determine switch recovery, thus requiring only a single-shot, high voltage trigger. No single compact device capable of providing a high rep-rate trigger was known. Typically, the trigger source for a high-power rep-ratable switch must be able to produce few-nanosecond risetime pulses at greater than a kilohertz rate while maintaining an output voltage level sufficient to initiate a discharge within the switch medium (usually greater than 100 kilovolts). In the past, multiple "single-shot" trigger sources attached to the switch in parallel through isolation diodes were necessary to achieve these requirements simultaneously. Unfortunately, the isolation diodes can add undesirable inductance to the trigger circuitry causing degradation in the achievable trigger risetime. In addition, the use of multiple trigger sources adds to the overall size and complexity of the pulsed-power system. Another common approach is to use a pulse transformer to step-up the output voltage of a relatively low voltage pulser containing fast switches (spark gap, thyratron, or solid-state switches) to the required high voltage. Although high voltages can be achieved with this method, the pulse transformer will limit the achievable risetime to an unsatisfactory level. Additional "peaking" spark gaps can be added to the output of such systems to improve the risetime, but this requires additional triggering circuitry and, as a result, more complexity and size. Any system containing a conventional spark gap as the switching element will be limited in rep-rate.

Various combinations of components forming Marx generators have long been used to produce single-shot, high-voltage triggers. These include patents to Asline, U.S. Pat. No. 3,845,322 issued Oct. 29, 1974, Feser, U.S. Pat. No. 3,821,561 issued Jun. 28, 1974, Bishop, U.S. Pat. No. 3,501,646 filed Oct. 3, 1967 and Rodewald, U.S. Pat. No. 3,504,191 issued Mar. 31, 1970. While these achieve varying degrees of voltage amplification, they lack high rep-rate capability. Other devices, such as that taught by Davis, U.S. Pat. No. 4,494,011 issued Jan. 15, 1985, use triode amplifier tubes to achieve a high power, short risetime pulse, but are limited in voltage. Finally, devices using a pulse forming network and transformer are known in the art as taught by Ranon, U.S. Pat. No. 4,996,494 issued Feb. 26, 1991 to produce high voltage but is also essentially a single shot device. U.S. Pat. Nos. 3,845,322, 3,821,561, 3,501,646, 3,504,191 are hereby incorporated by reference.

Coaxial Marx generators are also known in the art. One such generator is P/N 50082 available from Veradyne Corporation located at 330 North Victory Blvd., Burbank, Calif. 91502. These coaxial Marx generators are compact and pressurized with air to increase the hold-off voltage of the Marx elements. They are essentially single-shot devices.

SUMMARY OF THE INVENTION

It is an object of the instant invention to teach a High Repetition-Rate, Fast-Risetime High-Voltage Hydrogen Pulse Generator for generating a trigger for use in high-performance spark gap switches.

Another object of the present invention is to teach a trigger circuit exhibiting a pulse having a risetime less than 10 nanoseconds.

A further object of the present invention is to disclose a high rep-rate, fast risetime trigger generator having a capability of producing a pulse above 1 megavolt.

Yet another advantage of this invention is to teach a trigger generator having a repetition rate up to 10 kHz.

Another object of the present invention is to teach a trigger generator that is simpler, smaller, and less expensive than existing devices using single-shot diode arrays.

Still another object is to teach a trigger circuit that exhibits less inductance than pulse transformer systems.

Yet a further object of the present invention is to teach a triggering device that employs a Marx generator to achieve high voltage operation.

Applicants' invention employs a specially constructed Marx generator designed to use low value resistors and capacitors to permit a high rep-rate charging capability to the Marx, to use added stray capacitance by the relative positioning of components, and to house the Marx in a high-pressure hydrogen environment to decrease recovery time.

Additional objects, advantages and novel features of the invention will become apparent to those skilled in the art upon examination of the following description, or may be learned by practice of the invention. These and other objects and advantages of the invention may be realized and attained by means of the instrumentalities and combinations particularly pointed out in the appended claims.

To achieve the foregoing and other objects, and in accordance with the purpose of the present invention as embodied and broadly described herein, the present invention combines the advantages of high pressure hydrogen gas with the high voltage, fast-risetime capability of a compact coaxial Marx generator.

BRIEF DESCRIPTION OF THE DRAWINGS

FIG. 5a is a view of the pulse generator of the present invention sectioned for a top view.

FIG. 5b is the pulse generator of FIG. 5a sectioned from a bottom view.

DETAILED DESCRIPTION OF THE INVENTION

Figure 1:
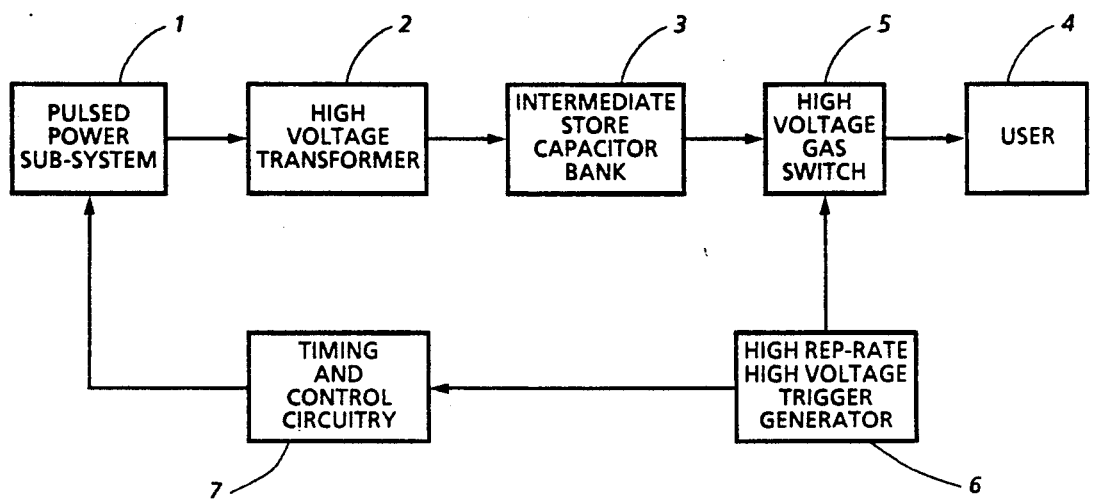
FIG. 1 depicts a pulsed power system block diagram having the instant invention as the triggering device.

An example of a pulsed power system where a fast, rep-rated pulse generator is required is shown in FIG. 1. Therein, pulsed power sub-system 1 delivers a series of relatively low-voltage pulses (circa 50 kV) to a step-up high-voltage transformer 2. The output of the transformer 2 repetitively charges an intermediate storage capacitor 3 to high voltage (circa 500 kV). Each time the intermediate capacitor 3 is charged, it is switched out to the user 4 via the high-voltage switch 5. The user may be any system requiring a high voltage, high rep-rate pulse train, such as an electron beam accelerator cavity. The high rep-rate pulse generator 6 of the present invention acts as the trigger for the switch 5. The rate at which this process occurs can be as high as 10 kHz, thus requiring both the pulse generator 6 and switch 5 to be capable of 100 microsecond recovery. Synchronization between the elements of the system is provided by the timing and control circuitry 7.

Figure 2:
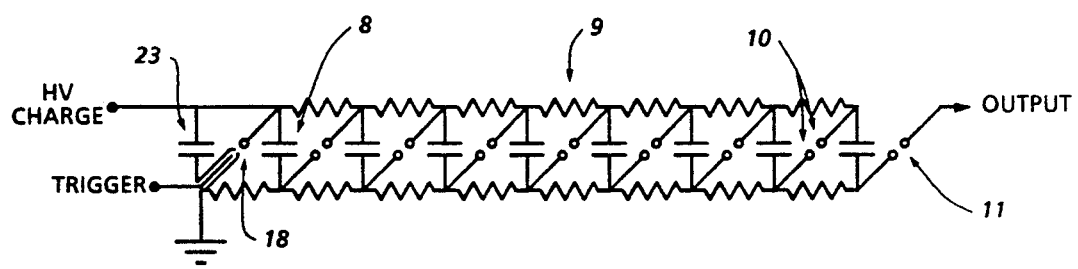
FIG. 2 is a schematic of a high repetition-rate Marx generator used as a pulse forming device in the pulse generator.

A simplified schematic of Applicants' invention is shown in FIG. 2. The basic operation of all Marx generators is centered around the concept of charging a series of N capacitor stages 8 in parallel through appropriate charging/isolation impedances 9 to a voltage $V_c$, and then discharging capacitor stages 8 in series through N switching elements 10 to produce an output of voltage $NV_c$. As such, the operation of a Marx generator can be divided into (1) a charging cycle, (2) an "erection" cycle, where the capacitors are switched into a serial configuration, and finally (3) a discharge cycle, where the Marx delivers energy to its load. The last gap 11 acts as a peaking switch and isolates the Marx from the load until it erects. In the device disclosed herein, the charging/isolation elements are simply carbon-composition resistors, the switching elements are fast-recovery hydrogen spark gaps, and the load is a trigger gap of a high-voltage, rep-rated, hydrogen spark gap switch such as is taught in U.S. Pat. No. 4,912,369 to Moran issued Mar. 27, 1990.

The value of capacitors 8 and resistors 9 were 500 picofarads and 1 kilohm in the specific embodiment built and tested by Applicants. The stray capacitance is a function of component placement and should be valued as taught below. The value of capacitors 8, resistors 9 and the stray capacitance will vary depending upon available circuit parameters and will vary as the gap parameters of the Marx vary. Particular design parameters are discussed below.

Figure 3:
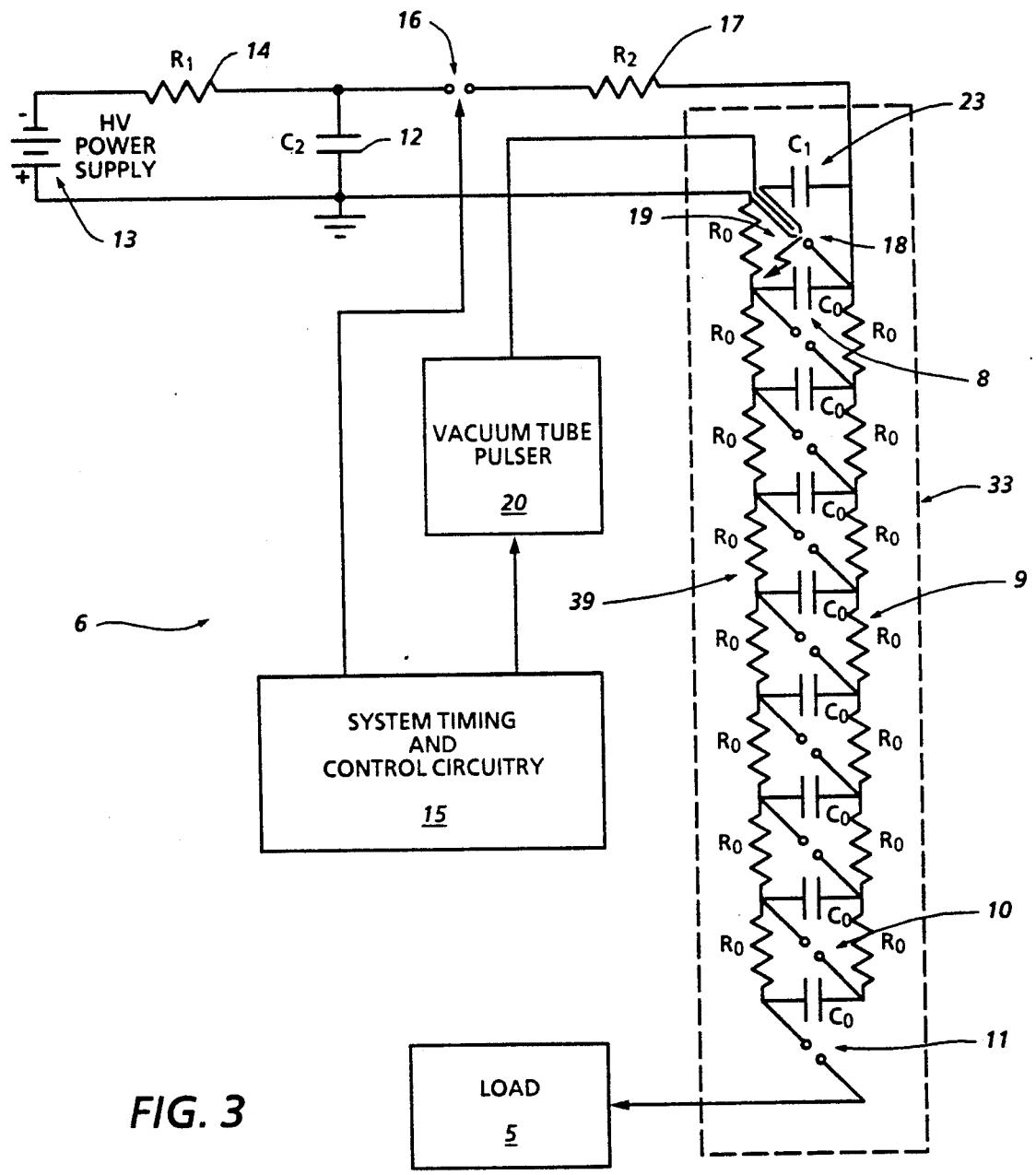
FIG. 3 is a schematic of the pulse generator of the instant invention showing the charging and triggering cycles.

Turning now to FIG. 3, the high performance pulse generator 6 of the present invention may be more fully understood. Therein the specially constructed Marx generator 39 is shown contained in a pressurized housing 33 where the switches 10 of the Marx operate in a pressurized hydrogen environment at approximately 100 psi. The pressurized hydrogen is primarily used to decrease the recovery time of the switches 10 of Marx generator 39, but also has the salutary benefit of insulating the electrical components within the pressurized housing 33, thus increasing the voltage hold-off.

The charging cycle of the hydrogen Marx circuit can also be understood from FIG. 3. A capacitive store 12 is charged by a high-voltage power supply 13 through an isolation resistor 14. Enough energy is stored in this capacitor to charge the Marx multiple times. At the appropriate moment, a trigger pulse from the system control circuitry 1 is applied to the charging switch 16 causing it to close. In the embodiment built and tested by Applicants, switch 16 was a triggered air spark gap switch to provide fast response time. The capacitor 12 now charges the Marx capacitors 8 through the current-limiting resistor 17 and the charging/isolation resistors 9 of the Marx. The charging resistors of the Marx must be small enough to allow all the capacitors in the chain to be sufficiently charged before the Marx is switched to the load. An approximate expression for the time-lag in the charging cycle between the Nth stage capacitor and the first stage capacitor is given by $$T_1 \approx N^2 R_0 C_0. \qquad \text{Formula (1)}$$

This time lag must be considered since rapid charging cycles are a requirement. Eight identical 30 kV, 500 pF Sprague ceramic capacitors and sixteen, 1 k$\Omega$, 2W carbon-composition resistors were used in the initial 8-stage Marx design, giving $T_1 = 32$ microseconds. The charging switch 16 from the capacitive store 12 remains closed so that the Marx can be recharged immediately after erection. An air-filled spark gap 16 suits this purpose since it is incapable of recovery within the time scales of interest.

A person skilled in the art will recognize that the Marx network may be constructed of various type components other than the Sprague ceramic capacitors and carbon-composition resistors used in the embodiment tested by Applicants. Likewise, the number of stages will be a design choice, depending upon the voltage amplification required.

Once charged, the Marx erection is initiated by applying a voltage pulse having a fast risetime to a trigatron switch 18 located in the first stage. This pulse results in both electric field distortion and ultraviolet illumination (UV) 19 of the first gap causing it to close rapidly. A vacuum-tube pulser 20 is employed to produce the 20 kV pulse necessary to trigger the trigatron switch. The remaining gaps are closed through a series of fast overvoltage transients coupled forward by stray capacitances which are present in the circuit.

Figure 4:
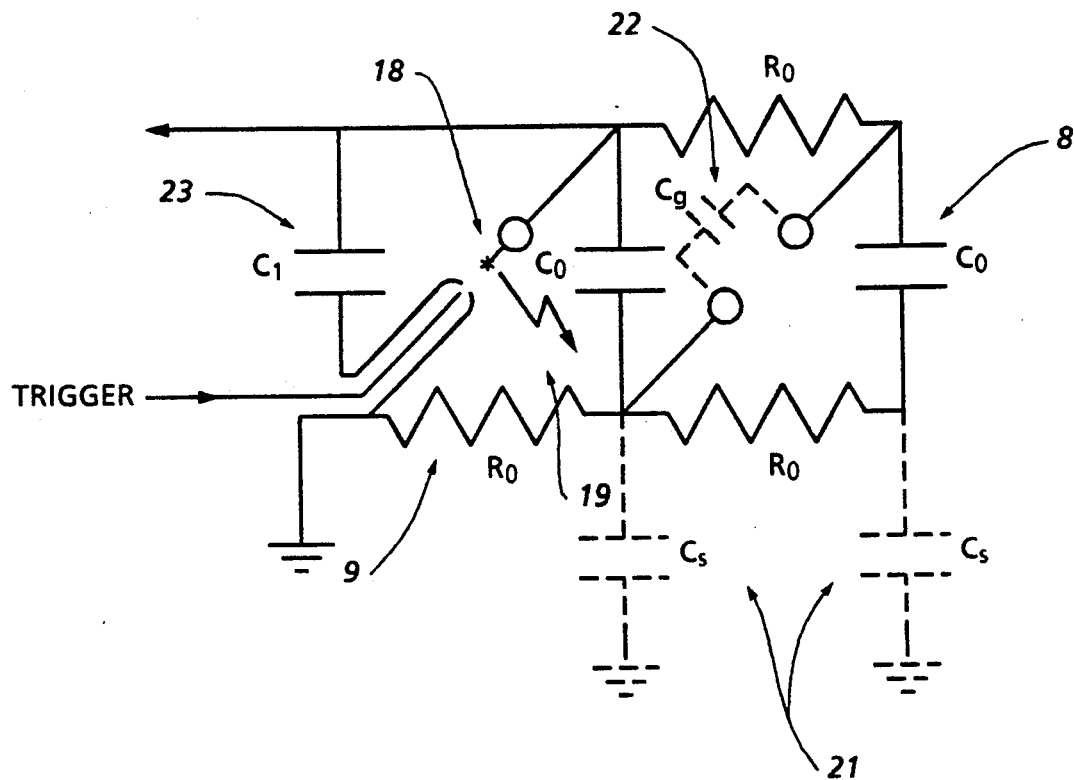
FIG. 4 is a schematic showing the stray capacitance of the circuit of FIG. 3.

Turning to FIG. 4, a simple model of a n=1, capacitively-coupled Marx is illustrated. In this illustration the stray capacitance is represented by the capacitance to ground, Cs, 21, and the gap capacitance, Cg, 22. Ignoring the isolation resistors 9, an equation for the overvoltage transient impressed on the second gap bridged by Cg, 22, is given by $$\Delta V = 2V_c \frac{1}{1 + \frac{C_g}{C_s}} \qquad \text{Formula (2)}$$

This gap, then, can be overvolted by up to a factor of two, provided $C_s >> C_g$. If the voltage transient is greater than the self-breakdown Voltage ($V_{sb}$) of the gap and is of sufficient duration, gap 2 will close. This process continues on up the capacitive chain, with each successive stage of the Marx being more severely overvolted, until all the stage capacitances are effectively placed in series. A conventional capacitor 23 included in the first stage of the Marx, across the first gap, enables a higher energy arc to be formed in the first stage, thus producing more intense UV illumination 19 of the remaining unbroken gaps. The total output voltage, as a result, is now $-8V_c$. The change in sign is due to the grounded arrangement of the trigatron switch. The overvoltage transient described, however, is approximately limited in duration to $$T_2 \approx R_o C_s \qquad \text{Formula (3)}$$

The operating range of the Marx will be determined by Formulas 1, 2 and 3. The operating range is the percentage of self-break voltage the spark gaps 10 can be undervolted while still erecting Marx 39. In order to operate at a 10 kHz rate, not only must the charging time constant of the Marx be less than 100 μs, but the overvoltage transient needs to last long enough to overcome the statistical time lag of the hydrogen gas while operating at a low percentage of self-break. This novel Marx employing undervolted hydrogen spark gap switches can be operated down to approximately 60% of self-break.

Figure 5C:
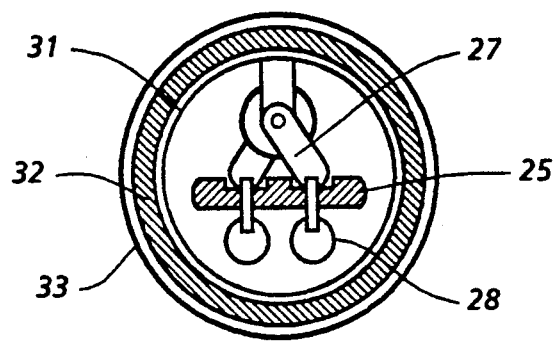
FIG. 5c is the pulse generator of FIG. 5a sectioned for an end view.

The housing from a commercially available coaxial Marx generator available from Veradyne, Part No. 50082, was used for initial experimental tests of the device. Internal components such as capacitors and resistors were changed. Additional elements were also added to enhance the stray capacitances. Sectional views of the Marx are shown in FIG. 5a, b and c. The Marx consists of eight identical 30 kV, 500 pF ceramic capacitors 8 arranged linearly along the length of a central insulating support structure 25 shown in FIG. 5b. The 1 kΩ, 2W carbon-composition charging resistors 9 in FIG. 5a are positioned to each side of the capacitors 8 and are coated with corona dope to prevent surface flashover and/or corona discharges. The capacitors 8 are mounted to the insulating support structure 25 via copper brackets 27 in FIG. 5a which are in turn connected to the brass electrodes 28 in FIG. 5b which form the gas switches 10. The electrodes are arranged beneath the insulating support structure 25 and are within line of sight of one another, enabling UV light from the first trigger gap 18 to illuminate the remaining gaps. A trigatron spark gap geometry is used in the first hydrogen gap 18 to trigger the Marx. An additional 500 pF capacitor 23 located across gap 18 ensures a bright UV flash upon triggering of the Marx. Eight, 1 inch-wide copper ring electrodes 31 attached to the ground side of the capacitors 8 enhance the stray capacitance to ground, enabling greater triggering range as discussed in Formulas 2 and 3 above. Cast epoxy 32 insulates the grounded outer metal tube which forms the pressurized housing 33 from the high-voltage of the Marx interior. The entire volume is filled with ultra-high purity hydrogen gas via the inlet 34 and outlet nipples 35. The Marx is charged, as well as triggered, through RG-59 coaxial cables 36 and 37. The output of the Marx is accessed through a high-voltage feedthrough 38. The entire device is approximately 2 feet in length and 4 inches in diameter.

Figure 6:
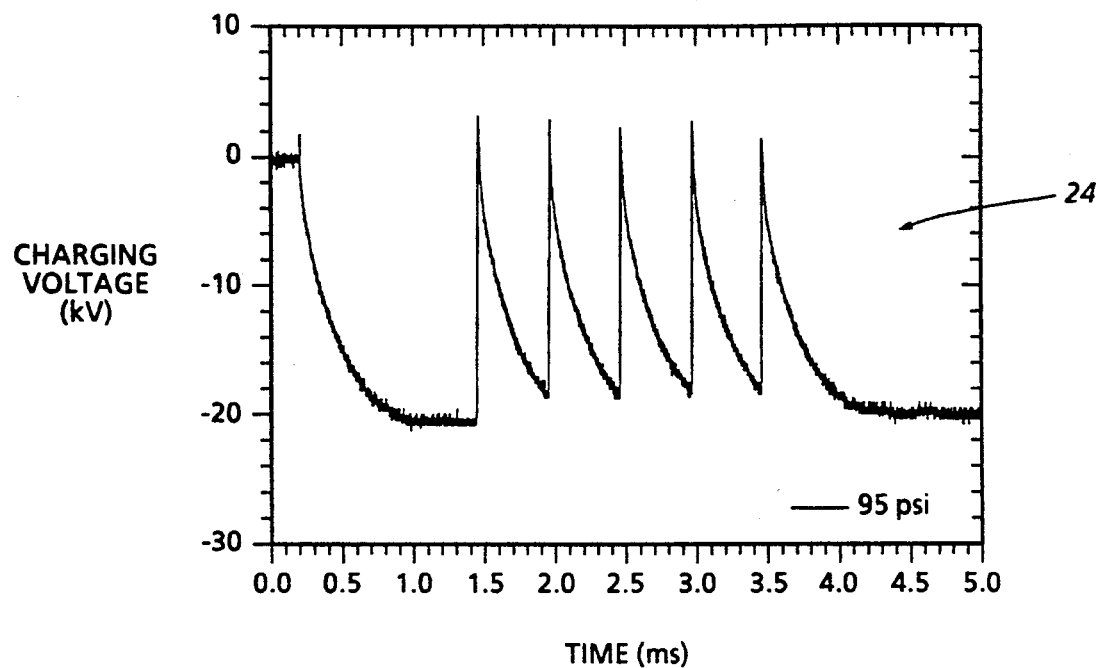
FIG. 6 is a graph showing the charging waveform into the Marx generator of the invention of FIG. 3 at 2 kHz.
Figure 7:
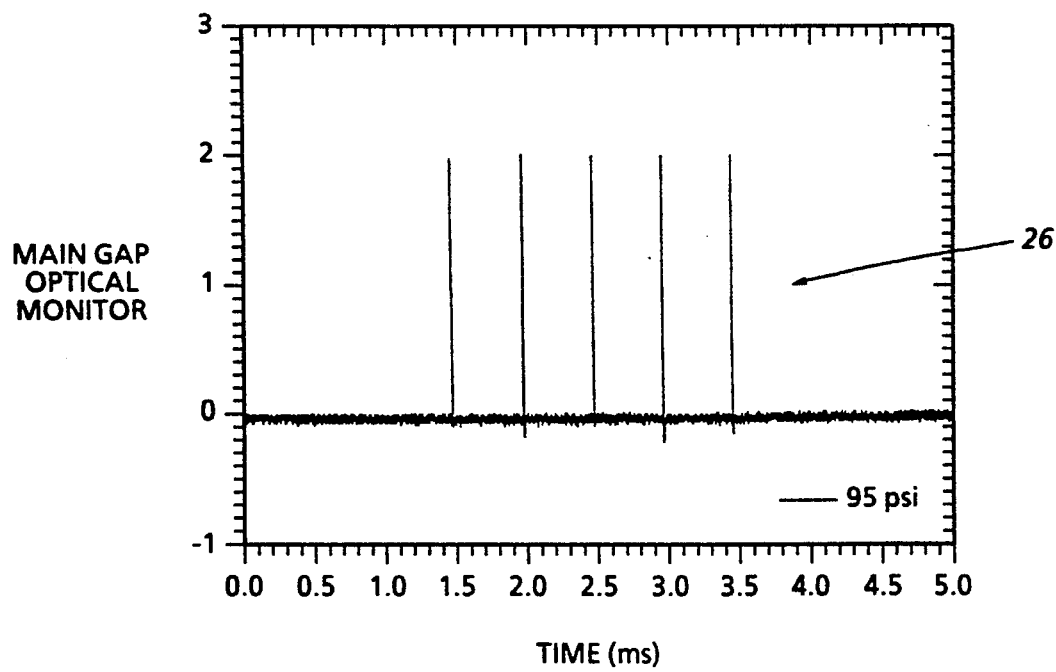
FIG. 7 is a graph showing an optical monitor of an arc produced by the pulse generator at 2 kHz.
Figure 8:
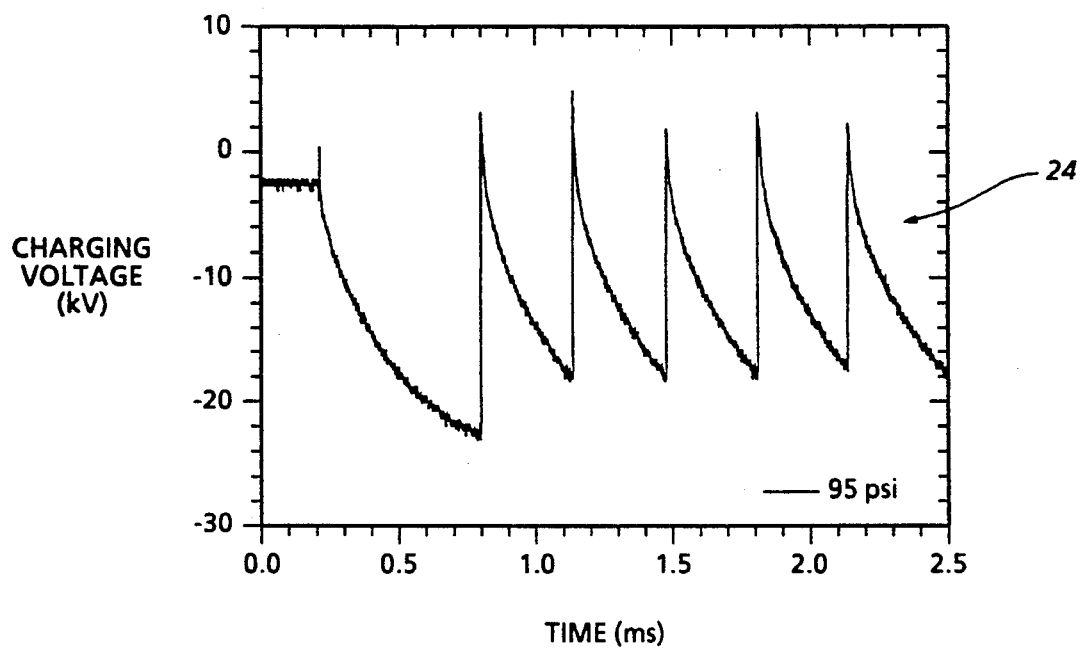
FIG. 8 is a graph showing the charging waveform into the Marx generator of the invention of FIG. 3 at 3 kHz.
Figure 9:
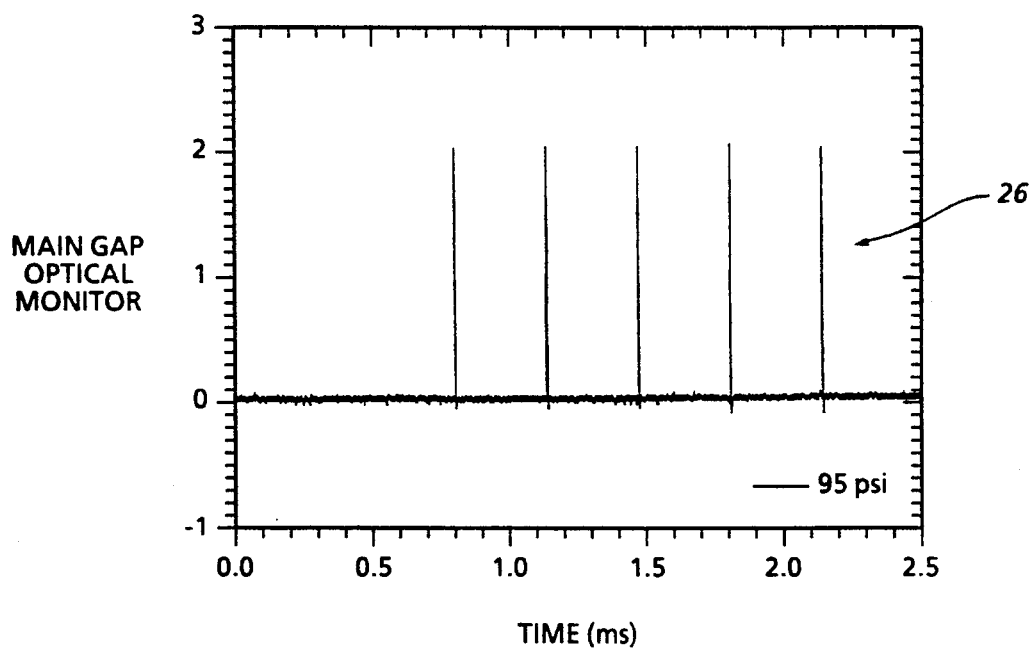
FIG. 9 is a graph showing an optical monitor of an arc produced by the pulse generator at 3 kHz.

Results from initial tests of one embodiment of the device tested show a high rep-rate, burst-mode trigger generator as graphed in FIG. 6. The Marx contained 95 psi of hydrogen and was charged to −20 kV, or approximately 75% of self-break voltage. The Marx was triggered in a five-pulse burst at a 2 kHz rate and was used to trigger a high-voltage hydrogen spark gap. As shown in the graph of FIG. 6, the charging voltage is shown along the Y axis and time along the X axis. The high rep-rate of the present invention may be clearly visualized from FIG. 6 which shows the voltage charging waveform 24 of the first gap 18 of the Marx 39. FIG. 7 shows the light output 26 from load 5 indicating when it triggers. FIGS. 8 and 9, like FIGS. 6 and 7, show additional results at a rep-rate of 3 kHz. The lower limit for reliable operation of the Marx was 75% of self-break voltage due to the current stray capacitance values and the limitations of the Marx pressure housing. This embodiment achieved rep-rates to a maximum of only 3 kHz due to the recovery characteristics of the hydrogen gas at 75% of self-break. Other embodiments which allow operation at 50% of self-break enable operation at higher repetition-rates approaching 10 kHz. Embodiments of the present invention where multiple stages of the Marx are specifically triggered should allow operation at even lower percentages of self-break voltage allowing even higher rep-rates.

Although the preferred embodiments of the invention have been shown and described herein, variation and modification may be made without departing from what is regarded as the scope of the invention.

What is claimed is:

1. A high-performance pulse generator for generating a short risetime, high rep-rate trigger to a load comprising;
 a pressurized housing charged with high-pressure hydrogen;
 a Marx generator having a repetition rate in excess of 1 kilohertz at output voltages above 100 kV mounted within said pressurized housing;
 means for charging said Marx generator at a repetition rate above 1 kilohertz;
 means for triggering said Marx generator at rep-rates in excess of 1 kilohertz;
 a timing and control circuit for controlling said means for triggering said Marx generator.

2. A high performance pulse generator according to claim 1 wherein said pressurized housing is charged with hydrogen to a pressure above 100 psi.

3. A high performance pulse generator according to claim 1 wherein said Marx generator is comprised of a network of capacitors and resistors forming isolating impedances.

4. A high performance pulse generator according to claim 1 wherein said means for charging said Marx generator is comprised of a high voltage power supply and a charging capacitor.

5. A high performance pulse generator according to claim 1 wherein said means for triggering is a vacuum tube variable trigger generator.

6. A high performance pulse generator for generating a short risetime, high rep-rate trigger to a load comprising;
   a high pressure housing for mounting the components forming a Marx generator within a pressurized hydrogen environment;
   a resister/capacitor network forming a marx generator having a repetition rate in excess of 1 kilohertz at voltages above 100 kilovolt for connection to the load mounted within said high-pressure housing;
   a charging capacitor having a capacitive store capability adequate to charge said resistor/capacitor network multiple times during a single discharge cycle of said charging capacitor;
   a high-voltage power supply to charge said charging capacitor;
   a controllable charging switch to connect said charging capacitor to said resistor/capacitor network during each high rep-rate burst of said resistor/capacitor network;
   a vacuum-tube pulser for triggering said resistor/capacitor network at the rep-rate desired;
   a timing and control circuit to synchronize charging and triggering of said resistor/capacitor network; and
   a quantity of hydrogen to charge said high-pressure housing.

* * * * *